United States Patent [19]

Beukema

[11] Patent Number: 5,509,034
[45] Date of Patent: Apr. 16, 1996

[54] FREQUENCY SYNCHRONIZING METHOD FOR A REFERENCE OSCILLATOR

[76] Inventor: Troy J. Beukema, 2020 Hassell Rd. #205, Hoffman Estates, Ill. 60195

[21] Appl. No.: 196,624

[22] Filed: Feb. 14, 1994

[51] Int. Cl.[6] .................................................. H04L 27/06
[52] U.S. Cl. ...................... 375/344; 375/343; 455/164.2; 455/192.2
[58] Field of Search ..................... 375/343, 344, 375/346, 354, 362, 365, 368; 455/161, 164.1, 164.2, 182.2, 192.2

[56] References Cited

U.S. PATENT DOCUMENTS

| | | | |
|---|---|---|---|
| 4,457,003 | 6/1984 | Reed | 375/344 |
| 4,485,477 | 11/1984 | Nossen | 375/344 |
| 5,276,706 | 1/1994 | Critchlow | 375/343 |

*Primary Examiner*—Stephen Chin
*Assistant Examiner*—Don Vo
*Attorney, Agent, or Firm*—Susan L. Lukasik

[57] ABSTRACT

A method and apparatus of frequency synchronization is described for a reference oscillator. Using a reference oscillator set to a first frequency, the process begins by scanning for a radio frequency carrier modulated with a predetermined pattern. The radio frequency carrier is located such that a received pattern comprising a frequency shifted version of the predetermined pattern is identified and time synchronization is established. The received pattern, the predetermined pattern, and stepped alterations to the first frequency are combined to provide a set of results that represent pattern correlation versus reference oscillator frequency. The first frequency is offset using the set of results, such that frequency synchronization is improved.

25 Claims, 4 Drawing Sheets

FREQUENCY SYNCHRONIZING METHOD FOR A REFERENCE OSCILLATOR

FIELD OF THE INVENTION

This invention relates to radio frequency (RF) receivers, including but not limited to time and frequency synchronization for RF transmissions.

BACKGROUND OF THE INVENTION

Modern communication systems are more commonly using linear modulation techniques due to the high spectral efficiency these techniques provide. A tunable reference oscillator is commonly used to provide a frequency reference for use in demodulating a received signal that was modulated with a linear modulation technique. The tunable reference oscillator normally provides the reference frequency for a frequency synthesizer, which in turn is tuned to the expected carrier frequency of a signal to be received. For simplicity of discussion, the reference oscillator/synthesizer combination can be viewed as a single oscillator that is referred to as a variable reference oscillator. The output of the variable reference oscillator is input to a receiver. The receiver then demodulates the received signal into a voice or data signal using the frequency signal from the variable reference oscillator.

When a communication unit is first powered up, the unit must find the appropriate frequencies on which it is to transmit and receive. This process can be long and difficult, especially if the variable reference oscillator is not in close frequency synchronization (sync) with the actual carrier frequency of the received signal. Further, if a large number of channels must be scanned, existing sync techniques are far too time consuming and require too large an amount of time to accomplish registration on the radio system within a reasonable time. As a further complication, in some situations, sync must be obtained without decoding the received information.

In order to keep a receiver in tune with the carrier frequency of a transmitted signal, various automatic frequency control (AFC) techniques are employed. In such tuning, various adjustments are made to the variable reference oscillator to keep it in tune with the carrier frequency of the transmitted signal, as that frequency may vary or fluctuate for numerous reasons. The frequency difference between the frequency of the variable reference oscillator and the carrier frequency is referred to as frequency error. These adjustments are often referred to as frequency offset adjustments or simply frequency offsets ($f_o$) and are used to correct frequency errors.

A potential problem with AFC techniques is the lack of precise knowledge of the tuning sensitivity of the reference oscillator. Typically, this sensitivity function is highly non-linear and varies with temperature. Hence, when a variable reference oscillator is adjusted, it is not known how accurately or to what degree the reference will be adjusted. If the adjusted frequency was not within approximately a narrow band, e.g., around 500 Hz or so, a narrowband sync correlation technique, as is known in the art, may miss the ability to synchronize after frequency tuning and lose the channel.

Typically, existing high capacity linear coherent demodulation systems are operational over only a very small bandwidth (±350 Hz for demodulation, ±500 Hz for reliable narrowband sync detect). The problem where the change in frequency may be greater than that which can be accommodated by a narrowband sync and/or demodulation algorithms is not as critical in existing FM (Frequency Modulation) carrier technologies due to the inherent ability of FM demodulators to operate in the context of larger frequency offsets.

Accordingly, there is a desire for the ability to accurately estimate the frequency offset of a received message.

DESCRIPTION OF A PREFERRED EMBODIMENT

Figure 1:
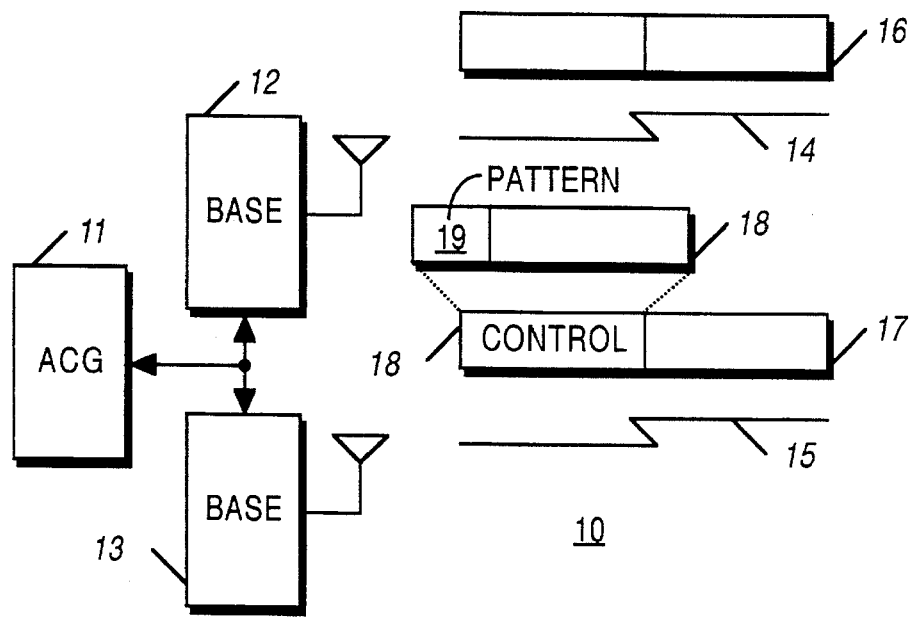
FIG. 1 is a block diagram of a communications system in accordance with the invention.

The following describes an apparatus for and method of quickly determining a frequency offset for use in adjusting the frequency of a reference oscillator, such that received data may be demodulated while minimizing errors due to frequency carrier synchronization. The present invention also provides for time and frequency sync without decoding received information.

A method of frequency synchronization is described for a reference oscillator. Using a reference oscillator set to a first frequency, the process begins by scanning for a radio frequency carrier modulated with a predetermined pattern. The radio frequency carrier is located such that a received pattern comprising a frequency shifted version of the predetermined pattern is identified and time synchronization is established. The received pattern, the predetermined pattern, and stepped alterations to the first frequency are combined to provide a set of results that represent pattern correlation versus frequency. The first frequency is offset using the set of results, such that frequency synchronization is improved.

Alternatively, while using a reference oscillator set to a first frequency, scanning is performed to find a radio frequency carrier modulated with a predetermined pattern. The radio frequency carrier is located such that a received pattern comprising a frequency shifted version of the predetermined pattern is identified and time synchronization is established. The received pattern is combined with the predetermined pattern to provide a first result. The first result is altered as a function of stepped alterations to the first frequency to provide a set of second results that represent pattern correlation versus frequency. Using the set of second results, the first frequency is offset such that frequency synchronization is improved.

An apparatus for synchronizing with respect to a carrier frequency that is modulated with a predetermined pattern is described. The apparatus includes an oscillator 25 having an output and a control input. A radio transceiver 23 and 24 is coupled to the output of the oscillator 25 and has a received signal output. A pattern detector 210 is coupled to the received signal output and is responsive to detection of a frequency shifted version of the predetermined pattern 210. A combiner 211 is coupled to the pattern detector and has an output that provides a combined version of the predetermined pattern and the frequency shifted version of the predetermined pattern. A correlator 212 is coupled to the output of the combiner 211 and has an output that provides a set of results that represents pattern correlation versus frequency. An oscillator controller 21 and 22 is coupled to the output of the correlator 212 and the control input of the oscillator 25, such that the oscillator 25 is controlled, at least in part, as a function of the set of results that represent pattern correlation versus frequency.

A communications system in accordance with the invention is shown in FIG. 1. An access control gateway (ACG) 11, such as an Access Control Gateway (ACG) available from Motorola, Inc., communicates with a plurality of base stations, including a first base station 12 and a second base station 13. Further details regarding ACGs may be obtained from U.S. patent application Ser. No. 08/131,535 titled "Method and Apparatus for Supporting at Least Two Communication Services in a Communication System" was filed on behalf of Jay Krebs et al. on Oct. 1, 1993, which application is incorporated herein by reference. The base station 12 may be a MIRS Base Repeater, available from Motorola, Inc. Each base station transmits information in the form of flames of equal length. Based on a timing sequence, a frame is transmitted every 15 milliseconds. For example, the first base station 12 transmits multiple flames of data 16 every 15 milliseconds based on a first timing signal 14. Similarly, the second base station 13 transmits multiple flames of information 17 based on a second timing signal 15. One of these frames of data may include control information 18. This control information includes a predetermined pattern 19 in the first 750 microseconds of the frame 18. This pattern 19 may be used, e.g., for time sync, frequency synchronization, and decoding of the control and data information modulated on the base transmission. Although the communications system 10 shown in FIG. 1 depicts two base stations, the present invention will be equally successful in systems with one or more base stations.

Figure 2:
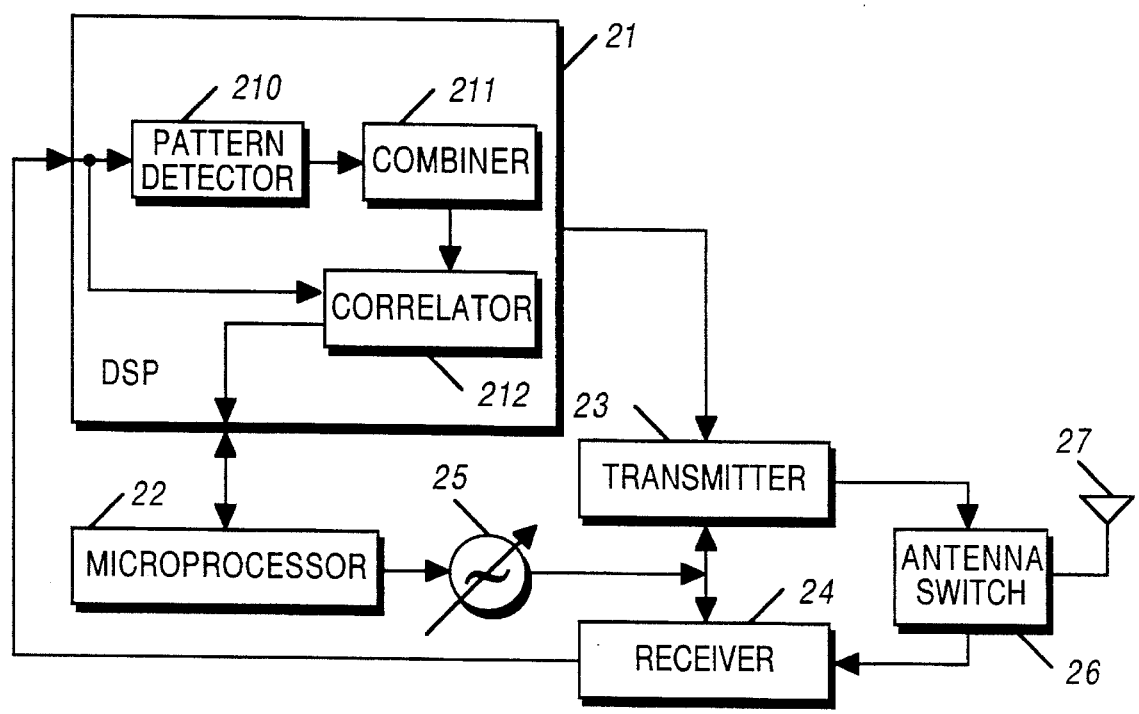
FIG. 2 is a block diagram of a communication unit in accordance with the invention.

A block diagram of a communication unit in accordance with the invention is shown in FIG. 2. The communication unit may be a portable or mobile radio, such as a MIRS Portable or a MIRS Mobile SU available from Motorola, Inc. A digital signal processor (DSP) 21 communicates with a microprocessor 22. The DSP 21, such as a DSP56166 available from Motorola, Inc., communicates with a transmitter 23 such that voice and/or data information may be transmitted via an antenna switch 26 through an antenna 27. The microprocessor 22, such as a 68HC16 available from Motorola, Inc., controls a reference oscillator 25. The reference oscillator 25 provides a carrier frequency reference to both the transmitter 23 and a receiver 24. This transmitter-receiver pair is often referred to as a radio transceiver. The reference oscillator 25 is adjusted by the microprocessor 22 to align both received and transmitted signals to the frequency transmitted by a base station 12. The receiver 24 sends the received signal to the DSP 21 which in turn invokes the process described in this invention to detect the presence and estimate the frequency offset of a received signal containing the predetermined pattern 19. Frequency offset is the difference in frequency between the carrier frequency of the received signal and the frequency provided by the reference oscillator 25 in the communication unit. The reference oscillator 25 is then adjusted to drive the estimated frequency offset to a small value to enable the base station 12 to successfully decode data sent by the DSP 21 to the transmitter 23. The adjustment of the reference oscillator 25 is performed by the microprocessor 22 which in turn receives a message from the DSP 21 containing the frequency offset information.

Figure 3:
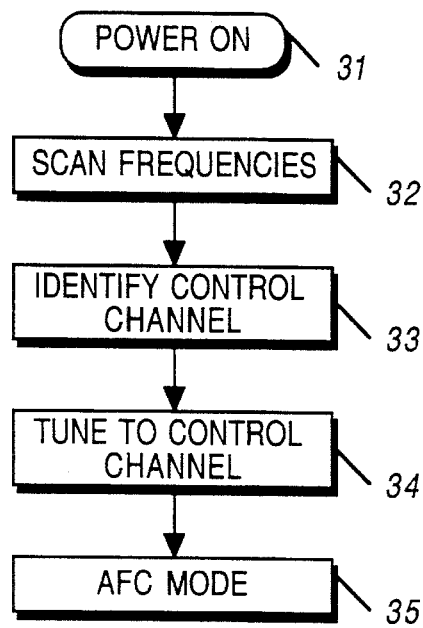
FIG. 3 is a flowchart showing general communication unit control with respect to frequency tuning in accordance with the invention.

A flowchart showing general communication unit control with respect to frequency tuning is shown in FIG. 3. At step 31, the power is turned on in the communication unit 20. At step 32, frequencies are scanned to identify candidate frequencies that may contain a control channel. At step 33, a control channel is identified in order to register the communication unit 20 on the system. At step 34, the communication unit 20 is tuned to the controlled channel. At step 35, the communication unit 20 turns to automatic frequency control mode. In automatic frequency control (AFC) mode, the communication unit 20 periodically updates the frequency of the reference oscillator 25 to keep the frequency offset small so that reliable communications take place between the communication unit 20 and the base station 12. The steps of the flowchart of FIG. 3 are performed by the DSP 21 and the microprocessor 22 of FIG. 2.

Figure 4:
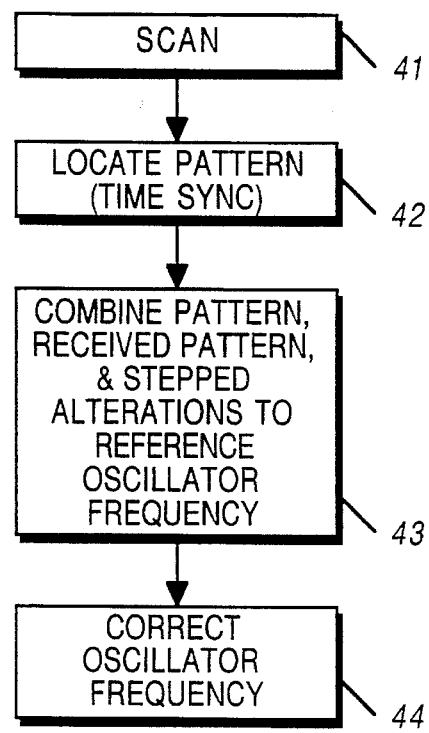
FIG. 4 is a flowchart showing steps necessary to identify and estimate the frequency offset of an outbound transmission in accordance with the invention.

A flowchart showing steps necessary to identify and estimate the frequency offset of an outbound transmission is shown in FIG. 4. At step 41, possible radio frequencies are scanned for possible control channels. At step 42, the DSP 21 locates within any received signals a predetermined pattern, such as the predetermined pattern 19 of FIG. 1, and provides time sync to this pattern. Time sync is established by comparing the received data with the predetermined pattern in a manner that enables detection of the predetermined pattern over a frequency range wide enough to accommodate the maximum frequency offset of the reference oscillator 25 as shown in FIG. 2. At step 43, the received pattern, the predetermined pattern, and stepped frequency alterations of the received pattern are processed to provide sync verification and enable frequency offset estimation. This sequence of steps is carried out by altering the frequency of the received data, thereby providing frequency translated received patterns, in discrete steps over a range of frequencies which span the maximum possible error of the reference oscillator, typically ±5 kHz. At each discrete step, the frequency translated received pattern is compared to the predetermined pattern in a manner that allows detection only over a narrow bandwidth. This comparison is referred to as narrowband sync correlation, as is known in the art. The frequency alterations, or steps, that indicate good comparison provide a set of results that enables sync verification and determination of the frequency offset. At step 44, the results of step 43 are used to correct the oscillator frequency. Oscillator frequency correction is accomplished by the microprocessor 22 modifying the frequency of the reference oscillator 25 in FIG. 2 by the frequency offset estimate determined from the sequence of stepped frequency alterations. Typically, the reference oscillator is tuned in discrete steps with a known nominal tuning sensitivity or frequency change per unit step. In the preferred embodiment, a typical value is 150 Hz per step in, for example, the MIRS SU mobile radio. The number of steps required to align the reference oscillator to the received base frequency is calculated by the microprocessor 22 from the frequency offset passed to it from the DSP 21. The steps of the flowchart of FIG. 4 are performed by the DSP 21 and the microprocessor 22 of FIG. 2.

Figure 5:
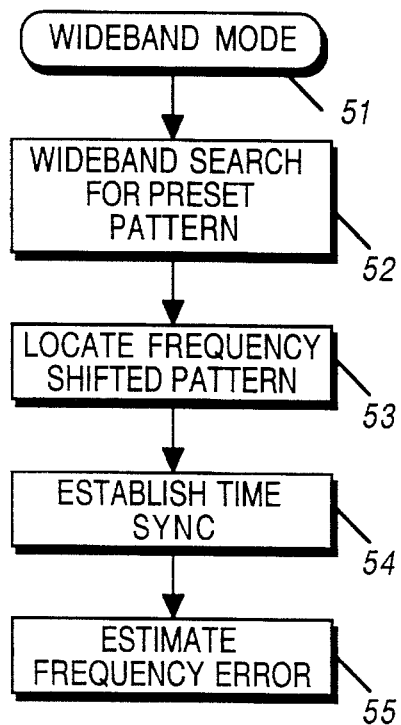
FIG. 5 is a flowchart showing a wideband mode of operation of determining frequency offset in accordance with the invention.

A flowchart showing a wideband mode of operation of determining frequency offset is shown in FIG. 5. At step 51, wideband mode is entered. Wideband mode refers to activating a manner of comparing the received data with the predetermined pattern 19 in a manner that enables detection of the predetermined pattern 19 over a range of frequencies wide enough to accommodate the maximum possible error of the reference oscillator 25. In contrast, the narrowband mode uses a method of comparison that enables detection of the predetermined pattern 19 over a range of frequencies much narrower than the maximum possible error of the reference oscillator 25. Typical detection bandwidth (the range of frequencies for which the predetermined pattern will be detected) for narrowband mode is ±500 Hz; typical detection bandwidth for wideband mode in this application is limited to approximately ±5 kHz. At step 52, a wideband search is engaged for a preset or predetermined pattern. This search is accomplished by comparing the received data in wideband mode against the predetermined pattern 19 over a minimum time interval equal to the repetition period of the predetermined pattern 19, where the repetition period is the time it takes for the predetermined pattern to repeat itself. At step 53, the DSP 21 locates a potentially frequency-shifted version of the predetermined pattern. The potentially frequency-shifted version of the pattern is considered located when the wideband mode comparison correlates sufficiently such that the received data has a high probability of being a valid version of the predetermined pattern 19. At step 54, time sync is established by comparing stepped frequency alterations, as previously described, of the received data against the predetermined pattern 19 using a narrowband comparison at each frequency step. Time sync is considered established when at least one stepped frequency alteration comparison shows that the received data is a valid match of the predetermined pattern above an appropriate threshold of probability, which threshold is determined on a system by system basis. At step 55, the frequency offset is estimated by forming a weighted average of the frequencies corresponding to the best comparison in the sequence of stepped frequency alteration comparisons performed while establishing time sync. The steps of the flowchart of FIG. 5 are performed by the DSP 21 of FIG. 2.

Figure 6:
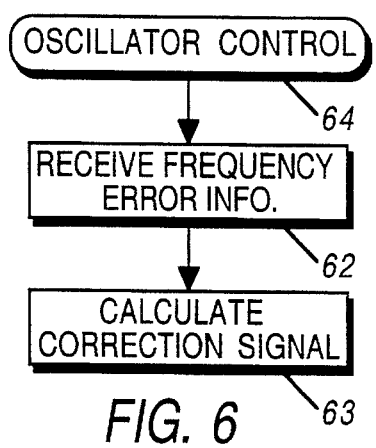
FIG. 6 is a flowchart showing oscillator control in accordance with the invention.

A flowchart showing oscillator control is shown in FIG. 6. At step 61, oscillator control is provided by a microprocessor such as the microprocessor 22 of FIG. 2. The microprocessor 22 initializes the frequency of the oscillator to a predetermined, e.g., factory calibrated, setting by sending a preset value to the reference oscillator prior to scanning for a channel. At step 62, the microprocessor 22 receives frequency offset information. At step 63, the microprocessor 22 calculates a correction signal based on the value of the frequency offset estimated and sent to it by the DSP 21. The correction signal takes the form of an offset to the predetermined preset value of the reference oscillator 25. The amount of the offset is calculated by the ratio of the frequency offset value to the tuning sensitivity of the reference oscillator. When no difference is detected between the current frequency of the reference oscillator 25 and the determined carrier frequency of the received signal, then the frequency offset is zero. The steps of the flowchart of FIG. 6 are performed by the microprocessor 22 of FIG. 2.

Figure 7:
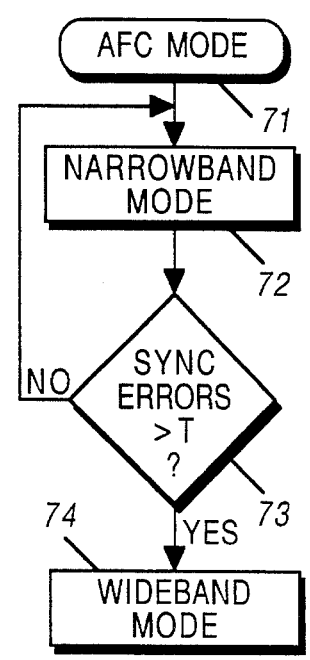
FIG. 7 is a flowchart showing automatic frequency control mode of operation in accordance with the invention.

A flowchart showing automatic frequency control mode of operation 71 is shown in FIG. 7. At step 72, narrowband sync correlation, also referred to narrowband mode in the present application, is performed whereby comparison of the received data with the predetermined pattern 19 is carried out using the narrowband comparison method as previously described. At step 73, as the number of sync errors is greater than the number T, a predetermined number, then the process continues with step 74. If at step 73 the number of sync errors is less than the number T, then the procedure continues with step 72. At step 73, a computation of the number of consecutive sync errors (where a sync error is defined as a comparison that does not match well enough to indicated that the received data contains the predetermined pattern 19) is made in narrowband mode. The DSP 21 is configured to run in wideband comparison mode when the number of consecutive errors exceed the threshold T. At step 74, the wideband mode of operation is performed, pursuant to the information set forth in FIG. 5 and its description. The steps of the flowchart of FIG. 7 are performed by the DSP 21 of FIG. 2.

Figure 8:
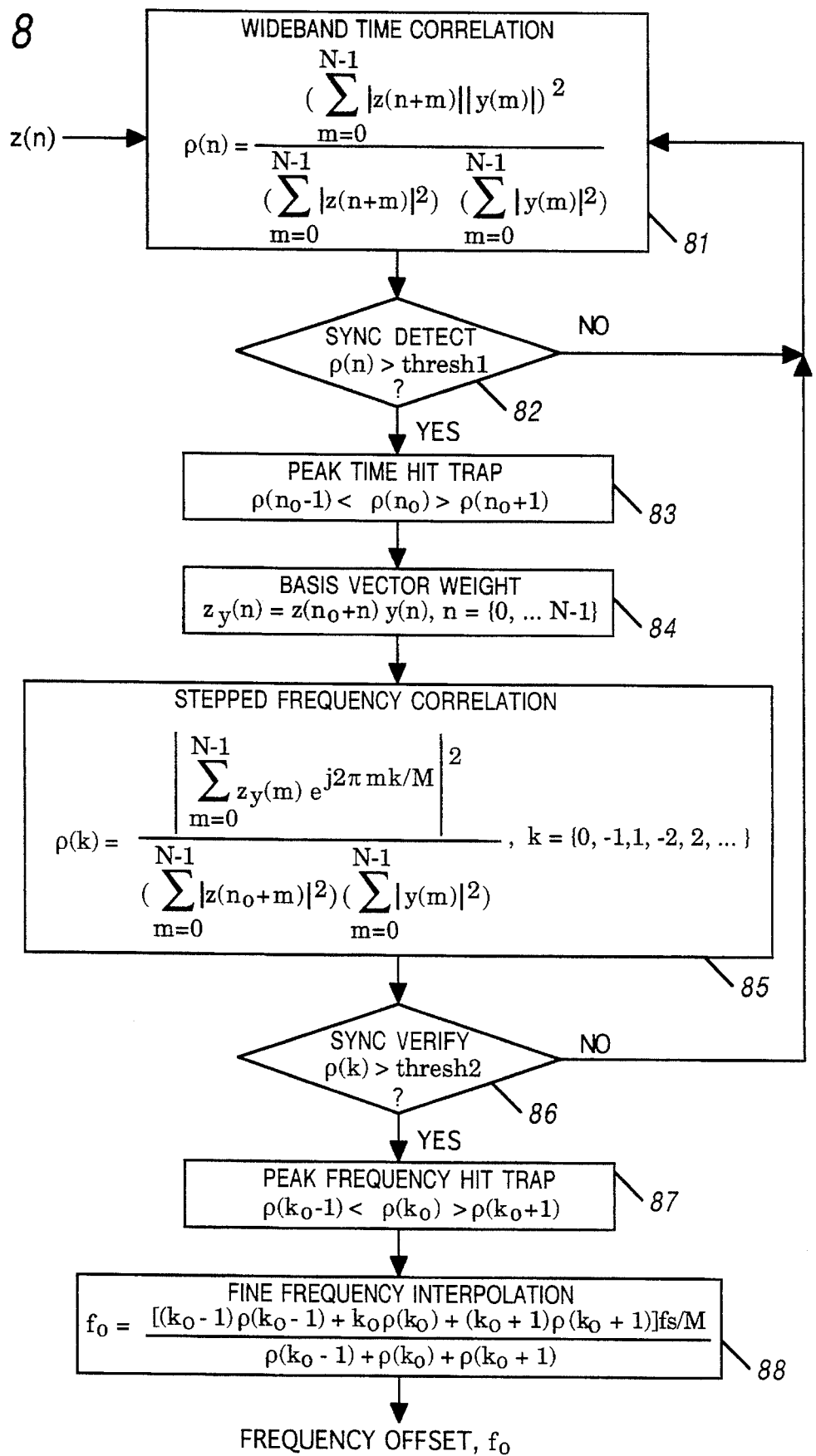
FIG. 8 is a flowchart showing wideband time and frequency sync in accordance with the invention.

A flowchart showing wideband time and frequency sync is shown in FIG. 8. The steps of the flowchart of FIG. 8 are performed by the DSP 21 of FIG. 2. At step 81, wideband time correlation, also known as magnitude correlation, is performed. Wideband time correlation is performed by computing a magnitude correlation on the received complex data sequence z(n), where z is a complex function of the unit increasing integer index, n. In the preferred embodiment of the present invention, the following formula is used to accomplish the correlation:

$$\rho(n) = \frac{\left(\sum_{m=0}^{N-1} |z(n+m)||y(m)|\right)^2}{\left(\sum_{m=0}^{N-1} |z(n+m)|^2\right)\left(\sum_{m=0}^{N-1} |y(m)|^2\right)},$$

where z(n) is the complex data sequence sent from the receiver to the DSP; y is a length N data sequence representing the sampled predetermined pattern, also referred to as a basis vector; p is the correlation coefficient ranging in value from 0.0 to 1.0; n is the integer increasing index representing advancing time in discrete intervals of the sample period; and N is the width of the predetermined pattern in received samples. For example, for a 750 μs pattern and a 36 kilosample/sec sample rate, N is 27. The values representing the sequence, y(m), may be complex values. In so performing, the DSP behaves as a pattern detector 210.

At step 82, sync detection is performed by using a threshold device that compares the correlation coefficient at output time "n" with a fixed threshold value "thresh1":

ρ(n)>thresh1, where thresh1 is the correlation threshold in the range 0 to 1. If ρ(n) is greater than thresh1, a wideband sync detect will occur in the preferred embodiment of the present invention.

At step 83, peak time trap function is performed, which function includes finding the index "n," also called $n_o$, such that:

ρ($n_o$−1)<ρ($n_o$)>ρ($n_o$+1).

The peak time trap function is also referred to as finding peak time domain correlation. When this function is performed, the peak time domain correlation is found to occur at time index no. This function identifies the location of the N samples of the predetermined pattern in the complex sample stream z(n) over the range $z(n_o)$ to $z(n_o+N-1)$.

At step 84, basis vector weight is applied, whereby the N samples of the received data sequence over which $\rho(n_o)$ was computed are weighted or scaled by the amplitude of the predetermined pattern 19 (or sync basis vector) to form the sequence $z_y(n)$ as described by the following formula:

$$z_y(n)=z(n_o+n)y(n), n=\{0, 1, \ldots N-1\}.$$

The procedure in step 84 improves the efficiency of the stepped frequency correlations to be performed in step 85 by eliminating the repeated multiplication of the sequence z(n) by y(n) over the stepped frequency range. In this procedure, the DSP 21 acts as a combiner 211. If y(n) constitutes complex values, then:

$$z_y(n)=z(n_o+n)y^*(n), n=\{0, 1, \ldots N-1\}.$$

At step 85, stepped frequency correlation is performed, whereby the following equation is performed:

$$\rho(k) = \frac{\left| \sum_{m=0}^{N-1} zy(m)e^{j2\pi mk/M} \right|^2}{\left( \sum_{m=0}^{N-1} |z(n_o+m)|^2 \right) \left( \sum_{m=0}^{N-1} |y(m)|^2 \right)},$$

$$k = \{0, -1, 1, -2, 2, \ldots\},$$

where M is a positive integer selected to set the frequency resolution of the stepped frequency correlations. For example, if M=64 and the sample rate is 36 kilosamples/sec, the frequency domain step size is 562.5 Hz. The step size must be selected so that consecutive frequency domain correlations will not skip the main lobe of the frequency correlation characteristic of the sync basis vector "y" (as will be described later). In the above equation, k is an integer representing a frequency domain index, where each unit value of "k" corresponds to the frequency domain step size. "k" is normally indexed starting from zero (the expected value of frequency offset) and increases in magnitude (+ and −) until either the frequency domain correlation is found or the desired bandwidth, which may be a subset of the full bandwidth, has been scanned. Thus, the DSP 21 functions as a correlator 212.

At step 86, sync is verified by performing the following calculation/comparison:

$$\rho(k) > \text{thresh2},$$

where thresh2 is the correlation threshold in the range 0 to 1. If $\rho(k)$ is greater thresh2, a narrowband sync detect will occur during the frequency scan operation in the preferred embodiment of the present invention.

At step 87, the peak frequency hit trap step is performed by finding the frequency index "k," also called $k_o$, where:

$$\rho(k_o-1) < \rho(k_o) > \rho(k_o+1).$$

In other words, the peak frequency domain correlation is isolated in a manner analogous to isolation of the peak time domain correlation of step 83.

At step 88, fine frequency interpolation is performed whereby:

$$f_o = f(k_o, \rho(k_o-1), \rho(k_o), \rho(k_o+1)),$$

yielding frequency offset estimate $f_o$, where $f_o$ represents the interpolated frequency and f(·) represents a function that takes as input the frequency index of peak correlation and the correlation coefficients about the peak correlation. The function f(·) then forms a weighted average of the frequencies corresponding to $k_o$, $k_o-1$, and $k_o+1$. A typical way to perform this interpolation estimate is a center-of-mass, or centroid formula, as follows:

$$f_o = \frac{((k_o-1)\rho(k_o-1) + k_o\rho(k_o) + (k_o+1)\rho(k_o+1))fs/M}{\rho(k_o-1) + \rho(k_o) + \rho(k_o+1)}.$$

where fs is the sample rate of the received sequence z(n). The result, $f_o$, is used to offset the frequency of the reference oscillator 25, i.e., the reference oscillator frequency is adjusted by the amount, $f_o$, and as such, the DSP 21 and microprocessor 22 function as an oscillator controller.

Figure 9:
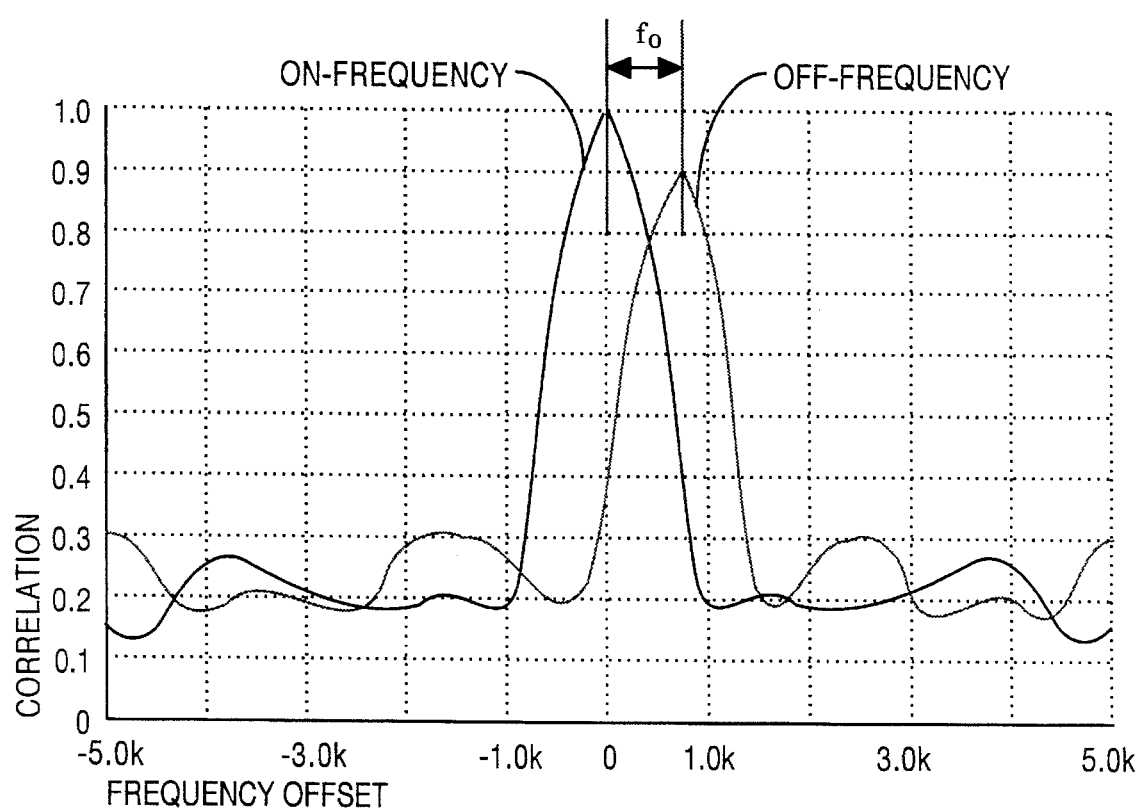
FIG. 9 is a graph of sync correlation versus frequency in accordance with the invention.

A graph of narrowband sync correlation versus frequency for a typical sync basis vector y is shown in FIG. 9. In this figure, the abscissa (x-axis) represents frequency and the ordinate (y-axis) represents normalized correlation. Because the main lobe of this function remains relatively insensitive to additive noise, it is possible to use the frequency domain correlation concept to accurately estimate frequency offset in a degraded RF channel. The narrowband correlation function falls to approximately 0.65 when the frequency offset of the pattern being compared reaches +500 Hz, which indicates that the minimum frequency domain step size for adequately sampling this function is on the order of 500 Hz. The value of M discussed in step 85 of FIG. 8 can be adjusted achieve this criteria. For example, a choice of M=64, which gives a frequency domain step size of 562.5 Hz for a sample rate of 36 kilosample/sec, is appropriate to adequately sample the function shown in FIG. 9.

The present invention provides the ability to detect a sync pattern on a frequency in a time interval as potentially short as the repetition period of the transmitted sync, given that the reference frequency of the radio may not be within a range detectable by a simple narrow-band frequency correlation. For example, if 1,200 channels are scanned at 30 ms per channel, a total of 36 seconds of scan time is required. Previous systems use a form of narrowband sync that cannot achieve this wide-bandwidth detection over such a short time interval. In certain applications, this approach alone may be sufficient. In other situations, where pattern detection may be less consistently accurate, additional verification may be desirable. For example, to increase the probability of correctly determining sync, one can look for consecutive sync hits spaced by the repetition period of the sync. This verification step helps insure that false detection of sync on random data does not occur.

The present invention provides the ability to accurately estimate the frequency offset of the received sync pattern without decoding the received modulation. The frequency estimation algorithm described in the present invention provides an improvement over sample discrimination methods as previously known.

In many applications, this approach alone may be sufficient. In other situations, the magnitude correlator may decorrelate too quickly with time to allow sufficiently reliable operation at certain sample rates. One solution for this problem is to replace the one-step magnitude correlator with two magnitude correlators. One magnitude correlator uses the sync pattern delayed by ¼ sample, and the second magnitude correlator uses the sync pattern advanced by ¼ sample. The maximum output of these two correlators in the threshold comparison step is used to provide the result.

The present invention also adds to the robustness of AFC processes. Because precise knowledge of the tuning sensitivity of the reference oscillator is not known, and further because the tuning sensitivity varies in a non-linear fashion and also varies with temperature, how accurately the reference will be adjusted is not known with AFC techniques. If the adjusted frequency was not within approximately 500 Hz, narrowband sync correlation, which process is known in the art, may miss the sync pattern after frequency tuning and lose the channel. This problem is eliminated through the use of the methods described in the present invention.

I claim:

1. A method comprising the steps of:

using a reference oscillator set to a first frequency, scanning for a radio frequency carrier modulated with a predetermined pattern;

locating the radio frequency carrier such that a received pattern comprising a frequency shifted version of the predetermined pattern is identified and time synchronization is established;

combining the received pattern, the predetermined pattern, and stepped alterations to the first frequency to provide a set of results that represent pattern correlation versus frequency, wherein the stepped alterations comprise at least two frequency translated versions of the received pattern;

interpolating the set of results using a centreid formula to offset the first frequency, such that frequency synchronization is improved.

2. The method of claim 1, wherein the step of locating includes performing the calculation:

$$\rho(n) = \frac{\left(\sum_{m=0}^{N-1} |z(n+m)||y(m)|\right)^2}{\left(\sum_{m=0}^{N-1} |z(n+m)|^2\right)\left(\sum_{m=0}^{N-1} |y(m)|^2\right)},$$

where $\rho$ is a correlation coefficient;

n is an integer index;

m is an integer index;

N is a width of the predetermined pattern;

z is a complex data sequence;

y is a length N data sequence representing the predetermined pattern.

3. The method of claim 1, wherein the step of combining further comprises the step of performing the calculation:

$z_y(n) = z(n_o+n)y(n)$, n={0 ... N-1}, where n is an integer index;

$n_o$ is time index;

N is a width of the predetermined pattern;

z is a complex data sequence;

y is a length N data sequence representing the predetermined pattern.

4. The method of claim 1, wherein the step of combining further comprises the step of performing the calculation:

$$\rho(k) = \frac{\left|\sum_{m=0}^{N-1} z_y(m)e^{j2\pi mk/M}\right|^2}{\left(\sum_{m=0}^{N-1} |z(n_o+m)|^2\right)\left(\sum_{m=0}^{N-1} |y(m)|^2\right)},$$

$k = \{0, -1, 1, -2, 2 \ldots\}$, where $\rho$ is a correlation coefficient;

$n_o$ is a time index;

k is an integer index;

m is an integer index;

N is a width of the predetermined pattern;

M is a positive integer;

z is a complex data sequence;

y is a length N data sequence representing the predetermined pattern.

5. The method of claim 1, wherein the step of interpolating further comprises finding the frequency offset, $f_o$, such that:

$$f_o = \frac{((k_o-1)\rho(k_o-1) + k_o\rho(k_o) + (k_o+1)\rho(k_o+1))fs/M}{\rho(k_o-1) + \rho(k_o) + \rho(k_o+1)},$$

where $\rho$ is a correlation coefficient;

$k_o$ is a frequency index;

fs is a sample rate of the received pattern;

M is a positive integer.

6. A method comprising the steps of:

using a reference oscillator set to a first frequency, scanning for a radio frequency carrier modulated with a predetermined pattern;

locating the radio frequency carrier such that a received pattern comprising a frequency shifted version of the predetermined pattern is identified and time synchronization is established;

combining the received pattern with the predetermined pattern to provide a first result;

altering the first result as a function of stepped alterations to the first frequency to provide a set of second results that represent pattern correlation versus frequency, wherein the stepped alterations comprise at least two frequency translated versions of the received pattern;

interpolating the set of second results using a centroid formula to offset the first frequency, such that frequency synchronization is improved.

7. The method of claim 6, wherein the step of locating includes performing the calculation:

$$\rho(n) = \frac{\left(\sum_{m=0}^{N-1} |z(n+m)||y(m)|\right)^2}{\left(\sum_{m=0}^{N-1} |z(n+m)|^2\right)\left(\sum_{m=0}^{N-1} |y(m)|^2\right)},$$

where $\rho$ is a correlation coefficient;

n is an integer index;

m is an integer index;

N is a width of the predetermined pattern;

z is a complex data sequence;

y is a length N data sequence representing the predetermined pattern.

8. The method of claim 6, wherein the step of combining further comprises the step of performing the calculation:

$z_y(n) = z(n_o+n) y(n)$, n={0 ... N-1}, where n is an integer index;

$n_o$ is a time index;

N is a width of the predetermined pattern;

z is a complex data sequence;

y is a length N data sequence representing the predetermined pattern.

9. The method of claim 6, wherein the step of altering further comprises the step of performing the calculation:

$$\rho(k) = \frac{\left|\sum_{m=0}^{N-1} zy(m)e^{j2\pi mk/M}\right|^2}{\left(\sum_{m=0}^{N-1} |z(n_o+m)|^2\right)\left(\sum_{m=0}^{N-1} |y(m)|^2\right)},$$

$k = \{0, -1, 1, -2, 2 \ldots\}$, where $\rho$ is a correlation coefficient;

$n_o$ is a time index;.

k is an integer index;

m is an integer index;

N is a width of the predetermined pattern;

M is a positive integer;

z is a complex data sequence;

y is a length N data sequence representing the predetermined pattern.

10. The method of claim 6, wherein the step of interpolating further comprises finding the frequency offset, $f_o$, such that:

$$f_o = \frac{((k_o-1)\rho(k_o-1) + k_o\rho(k_o) + (k_o+1)\rho(k_o+1))fs/M}{\rho(k_o-1) + \rho(k_o) + \rho(k_o+1)},$$

where $\rho$ is a correlation coefficient;

$k_o$ is a frequency index;

fs is a sample rate of the received pattern;

M is a positive integer.

11. A method comprising the steps of:

performing wideband time correlation on a received signal and an expected signal;

detecting time synchronization by comparing the received signal to the expected signal;

finding a peak time for correlating the received signal to the expected signal;

scaling the received signal to provide a scaled received signal;

stepped frequency correlating the scaled received signal and the expected signal to provide a set of values representing pattern correlation as a function of frequency;

verifying time synchronization;

determining a peak frequency for correlating the scaled received signal to the expected signal;

fine frequency interpolating the set of values using a centroid formula, thereby yielding a frequency offset;

adjusting a variable frequency oscillator by the frequency offset.

12. The method of claim 11, wherein the step of performing wideband time correlation includes performing the calculation:

$$\rho(n) = \frac{\left(\sum_{m=0}^{N-1} |z(n+m)||y(m)|\right)^2}{\left(\sum_{m=0}^{N-1} |z(n+m)|^2\right)\left(\sum_{m=0}^{N-1} |y(m)|^2\right)},$$

where $\rho$ is a correlation coefficient;

n is an integer index;

m is an integer index;

N is a width of the expected signal;

z is a complex data sequence;

y is a length N data sequence representing the expected signal.

13. The method of claim 11, wherein the step of detecting further comprises correlating and comparing $\rho(n) > \text{thresh1}$, where thresh1 is the correlation threshold in the range 0 to 1, $\rho$ is a correlation coefficient, and n is an integer index.

14. The method of claim 11, wherein the step of finding further comprises the step of finding the index $n_o$, such that $\rho(n_o-1) < \rho(n_o) > \rho(n_o+1)$, where $\rho$ is a correlation coefficient.

15. The method of claim 11, wherein the step of scaling further comprises the step of performing the calculation:

$z_y(n) = z(n_o+n)y(n)$, $n=\{\ldots N-1\}$, where n is an integer index;

$n_o$ is a time index;

N is a width of the expected signal;

z is a complex data sequence;

y is a length N data sequence representing the expected signal.

16. The method of claim 11, wherein the step of stepped frequency correlating further comprises the step of performing the calculation:

$$\rho(k) = \frac{\left|\sum_{m=0}^{N-1} zy(m)e^{j2\pi mk/M}\right|^2}{\left(\sum_{m=0}^{N-1} |z(n_o+m)|^2\right)\left(\sum_{m=0}^{N-1} |y(m)|^2\right)},$$

$k = \{0, -1, 1, -2, 2 \ldots\}$, where $\rho$ is a correlation coefficient;

$n_o$ is a time index;

k is an integer index;

m is an integer index;

N is a width of the expected signal;

M is a positive integer;

z is a complex data sequence;

y is a length N data sequence representing the expected signal.

17. The method of claim 11, wherein the step of verifying further comprises the comparing $\rho(k) > \text{thresh2}$, where thresh2 is a correlation threshold in the range 0 to 1, $\rho$ is a correlation coefficient, and k is an integer index.

18. The method of claim 11, wherein the step of determining a peak frequency further comprises the step of finding $k_o$ such that:

$\rho(k_o-1) < \rho(k_o) > \rho(k_o+1)$, where $\rho$ is a correlation coefficient.

19. The method of claim 11, wherein the step of fine frequency interpolating further comprises finding the frequency offset, $f_o$, such that:

$$f_o = \frac{((k_o-1)\rho(k_o-1) + k_o\rho(k_o) + (k_o+1)\rho(k_o+1))fs/M}{\rho(k_o-1) + \rho(k_o) + \rho(k_o+1)},$$

where $\rho$ is a correlation coefficient;

$k_o$ is a frequency index;

fs is a sample rate of the received pattern:

M is a positive integer.

20. An apparatus for synchronizing with respect to a carrier frequency that is modulated with a predetermined pattern, the apparatus comprising:

an oscillator having an output and a control input;

a radio transceiver coupled to the output of the oscillator and having a received signal output;

a pattern detector, coupled to the received signal output, arranged and constructed to detection off a frequency shifted version of the predetermined pattern;

a combiner coupled to the pattern detector and having an output that provides a combined version of the predetermined pattern and the frequency shifted version of the predetermined pattern;

a correlator coupled to the output of the combiner and the received signal output and having an output that provides a set of results that represents pattern correlation versus frequency;

an oscillator controller that is coupled to the output of the correlator and the control input of the oscillator, such that the oscillator is controlled, at least in part, as an interpolation, using a centroid formula, of the set of results that represent pattern correlation versus frequency.

21. The apparatus of claim 20, wherein the pattern detector performs the calculation:

$$\rho(n) = \frac{\left(\sum_{m=0}^{N-1} |z(n+m)||y(m)|\right)^2}{\left(\sum_{m=0}^{N-1} |z(n+m)|^2\right)\left(\sum_{m=0}^{N-1} |y(m)|^2\right)},$$

where $\rho$ is a correlation coefficient;

n is an integer index;

m is an integer index;

N is a width of the predetermined pattern;

z is a complex data sequence;

y is a length N data sequence representing the predetermined pattern.

22. The apparatus of claim 20, wherein the combiner performs the calculation:

$$z_y(n) = z(n_o+n)y(n), n = \{0 \ldots N-1\},$$

where n is an integer index;

$n_o$ is a time index;

N is a width of the predetermined pattern;

z is a complex data sequence;

y is a length N data sequence representing the predetermined pattern.

23. The apparatus of claim 20, wherein the correlator performs the calculation:

$$\rho(k) = \frac{\left|\sum_{m=0}^{N-1} zy(m)e^{j2\pi mk/M}\right|^2}{\left(\sum_{m=0}^{N-1} |z(n_o+m)|^2\right)\left(\sum_{m=0}^{N-1} |y(m)|^2\right)},$$

$k = \{0, -1, 1, -2, 2 \ldots\}$, where $\rho$ is a correlation coefficient:

$n_o$ is a time index:

k is an integer index;

m is an integer index;

N is a width of the predetermined pattern:

M is a positive integer;

z is a complex data sequence:

y is a length N data sequence representing the predetermined pattern.

24. The apparatus of claim 20, wherein the oscillator controller finds a frequency offset, $f_o$, such that:

$$f_o = \frac{((k_o-1)\rho(k_o-1) + k_o\rho(k_o) + (k_o+1)\rho(k_o+1))fs/M}{\rho(k_o-1) + \rho(k_o) + \rho(k_o+1)},$$

where $\rho$ is a correlation coefficient:

$k_o$ is a time index:

fs is a sample rate of the received signal output;

M is a positive integer.

25. The apparatus of claim 20, wherein the oscillator, the radio transceiver, the pattern detector, the combiner, the correlator, and the oscillator controller are disposed in a communication unit.

* * * * *

UNITED STATES PATENT AND TRADEMARK OFFICE
CERTIFICATE OF CORRECTION

PATENT NO. : 5,509,034
DATED : April 16, 1996
INVENTOR(S) : Troy J. Beukema

It is certified that error appears in the above-indentified patent and that said Letters Patent is hereby corrected as shown below:

Column 9, Claim 1, Line 22, --centreid-- should be --centroid--

Signed and Sealed this

Ninth Day of July, 1996

Attest:

BRUCE LEHMAN

Attesting Officer

Commissioner of Patents and Trademarks